United States Patent
Park et al.

(10) Patent No.: US 8,283,688 B2
(45) Date of Patent: Oct. 9, 2012

(54) ORGANIC LIGHT EMITTING DIODE DISPLAY

(75) Inventors: Soon-Ryong Park, Yongin (KR); Tae-Kyu Kim, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 123 days.

(21) Appl. No.: 12/855,648

(22) Filed: Aug. 12, 2010

(65) Prior Publication Data

US 2011/0037095 A1 Feb. 17, 2011

(30) Foreign Application Priority Data

Aug. 13, 2009 (KR) .................. 10-2009-0074902

(51) Int. Cl.
  *H01L 31/00* (2006.01)
(52) U.S. Cl. .................. 257/98; 257/E33.061
(58) Field of Classification Search .......... 257/98, 257/E33.061
  See application file for complete search history.

(56) References Cited

U.S. PATENT DOCUMENTS

| | | | | |
|---|---|---|---|---|
| 7,766,535 B2 * | 8/2010 | Kim | | 362/633 |
| 7,993,945 B2 * | 8/2011 | Ikeda et al. | | 438/29 |
| 8,022,625 B2 * | 9/2011 | Hayashi | | 313/512 |
| 2010/0051994 A1 * | 3/2010 | Katsuno et al. | | 257/98 |
| 2010/0051995 A1 * | 3/2010 | Katsuno et al. | | 257/98 |

FOREIGN PATENT DOCUMENTS

| | | |
|---|---|---|
| JP | 8-248436 | 9/1996 |
| JP | 2001-242472 | 9/2001 |
| JP | 2003-317634 | 11/2003 |
| JP | 2004-117523 | 4/2004 |
| KR | 10-0675625 | 2/2007 |
| KR | 10-0745328 | 8/2007 |
| KR | 10-2007-01201415 A | 12/2007 |
| KR | 10-0784012 | 12/2007 |

* cited by examiner

*Primary Examiner* — Howard Weiss
*Assistant Examiner* — Steven Rao
(74) *Attorney, Agent, or Firm* — Christie, Parker & Hale, LLP (57) ABSTRACT

An organic light emitting diode (OLED) display includes a display substrate assembly including an organic light emitting structure, an encapsulation substrate assembly disposed facing the display substrate assembly, a sealant disposed between the display substrate assembly and the encapsulation substrate assembly to seal the display substrate assembly and the encapsulation substrate assembly with each other, and a substrate deformation protection body disposed between the sealant and the organic light emitting structure.

12 Claims, 9 Drawing Sheets

ORGANIC LIGHT EMITTING DIODE DISPLAY

CROSS-REFERENCE TO RELATED APPLICATION

This application claims priority to and the benefit of Korean Patent Application No. 10-2009-0074902, filed in the Korean Intellectual Property Office on Aug. 13, 2009, the entire content of which is incorporated herein by reference.

BACKGROUND

1. Field

The following description relates generally to an organic light emitting diode (OLED) display.

2. Description of Related Art

An organic light emitting diode (OLED) display includes a display substrate assembly including an organic light emitting diode, an encapsulation substrate assembly disposed facing the display substrate assembly and protecting the organic light emitting diode of the display substrate assembly, and a sealant sealing the display substrate assembly and the encapsulation substrate assembly in a vacuum-tight manner.

In order to seal the display substrate assembly and the encapsulation substrate assembly in a vacuum-tight manner, the sealant is provided between the display substrate assembly and the encapsulation substrate assembly and then hardened.

However, when the sealant is hardened, heat energy required for the hardening causes a volume reduction of the sealant so that a portion of the encapsulation substrate assembly that contacts the sealant may be deformed and thus a torsion (or twist) of the encapsulation substrate assembly may occur.

The encapsulation substrate assembly bends due to the twist thereof so that Newton's rings are generated at the bent portions.

An attaching and vacuum-sealing process of the display substrate assembly and the encapsulation substrate assembly by using a sealant is performed in a substrate array state in which a plurality of unit cells are provided, and when the hardening process of the sealant is finished, cell units of the OLED display are cut from the substrate array.

However, when the encapsulation substrate assembly corresponding to the surroundings of the sealant is twisted, the twisted encapsulation substrate assembly may not be smoothly cut out or may be damaged. Even if it is satisfactorily cut out, the cut-out state may cause a substrate defect around the sealant during a manufacturing process of the OLED display and thereby causing strength deterioration. Moreover, the Newton's rings that may occur in the surroundings of the sealant, that is, a substrate edge portion, cause a display defect that results in an unsatisfactory user experience.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of an embodiment of the present invention is directed toward an organic light emitting diode (OLED) display capable of suppressing an occurrence of a defect due to hardening of its sealant.

An aspect of an embodiment of the present invention is directed toward an organic light emitting diode (OLED) display capable of reducing or minimizing twist of its encapsulation substrate assembly.

An OLED display according to an exemplary embodiment includes a display substrate assembly including an organic light emitting structure; an encapsulation substrate assembly facing the display substrate assembly; a sealant between the display substrate assembly and the encapsulation substrate assembly to seal the display substrate assembly and the encapsulation substrate assembly with each other; and a substrate deformation protection body between the sealant and the organic light emitting structure.

In one embodiment, a distance between the substrate deformation protection body and the sealant is smaller than a distance between the sealant and the organic light emitting structure.

In one embodiment, the height of the substrate deformation protection body is greater than that of the sealant.

In one embodiment, the sealant is arranged along edge portions of the display substrate assembly and the encapsulation substrate assembly, and the substrate deformation protection body includes a plurality of substrate deformation protection bodies. The plurality of substrate deformation protection bodies may be arranged apart from the sealant by substantially identical distances. Also, the plurality of substrate deformation protection bodies each may have uniform widths along the arrangement direction of the sealant. Alternatively, the plurality of substrate deformation protection bodies may have non-uniform widths along the arrangement direction of the sealant. The sealant may include an extended curved line portion, and a first substrate deformation protection body among the plurality of substrate deformation protection bodies corresponding to the curved line portion of the sealant may have a width that is larger than those of other non-curved line corresponding substrate deformation protection bodies among the plurality of substrate deformation protection bodies along the arrangement direction of the sealant.

In one embodiment, the sealant is disposed to extend along the edge portions of the display substrate assembly and the encapsulation substrate assembly, and the substrate deformation protection body extends along the extension direction of the sealant.

In one embodiment, the substrate deformation protection body has a polygonal sectional shape with respect to a direction that is parallel with the display substrate assembly.

In one embodiment, the substrate deformation protection body has a circular sectional shape with respect to a direction that is parallel with the display substrate assembly.

According to embodiments of the present invention, the OLED display includes the substrate deformation protection body so that the Newton's rings can be suppressed by reducing or minimizing a twist of the encapsulation substrate assembly with the substrate deformation protection body.

Furthermore, when the OLED displays are cut from the substrate array, damage to the OLED display can be suppressed by reducing or minimizing a twist of the encapsulation substrate with the substrate deformation protection substrate included in the OLED display.

Furthermore, the OLED display has an improved strength characteristic since it includes the substrate deformation protection body to suppress a defect of the substrate around the sealant.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Furthermore, with exemplary embodiments, detailed description is given for the constituent elements in the first exemplary embodiment with reference to the relevant drawings by using the same reference numerals for the same constituent elements, while only different constituent elements from those related to the first exemplary embodiment are described in other exemplary embodiments.

Certain parts/elements of certain embodiments of the present invention may be omitted for clarity of description purposes, and like reference numerals designate like elements throughout the specification.

Furthermore, the size and thickness of the respective structural components shown in the drawings may be arbitrarily illustrated for convenience of description purposes, and the present invention is not necessarily limited to as illustrated.

In the drawings, the thickness of layers, films, panels, regions, etc., are exaggerated for clarity and explanatory convenience purposes. It will be understood that when an element such as a layer, film, region, or substrate is referred to as being "on" another element, it can be directly on the other element or intervening elements may also be present therebetween. In contrast, when an element is referred to as being "directly on" another element, there are no intervening elements present therebetween.

The drawings illustrate an active matrix (AM) organic light emitting diode display with a 2Tr-1Cap structure where two thin film transistors and a capacitor are formed at each pixel, but the present invention is not limited thereto. Accordingly, the organic light emitting diode display according to embodiments of the present invention may have three or more thin film transistors and two or more capacitors per pixel, with separate wire having various suitable and different structures. The pixel is a minimal unit for displaying an image, and is provided at respective pixel areas. The organic light emitting diode display 101 displays images through a plurality of pixels.

Hereinafter, a first exemplary embodiment of the present invention will be described in more detail with reference to FIG. 1 and FIG. 2.

Figure 1:
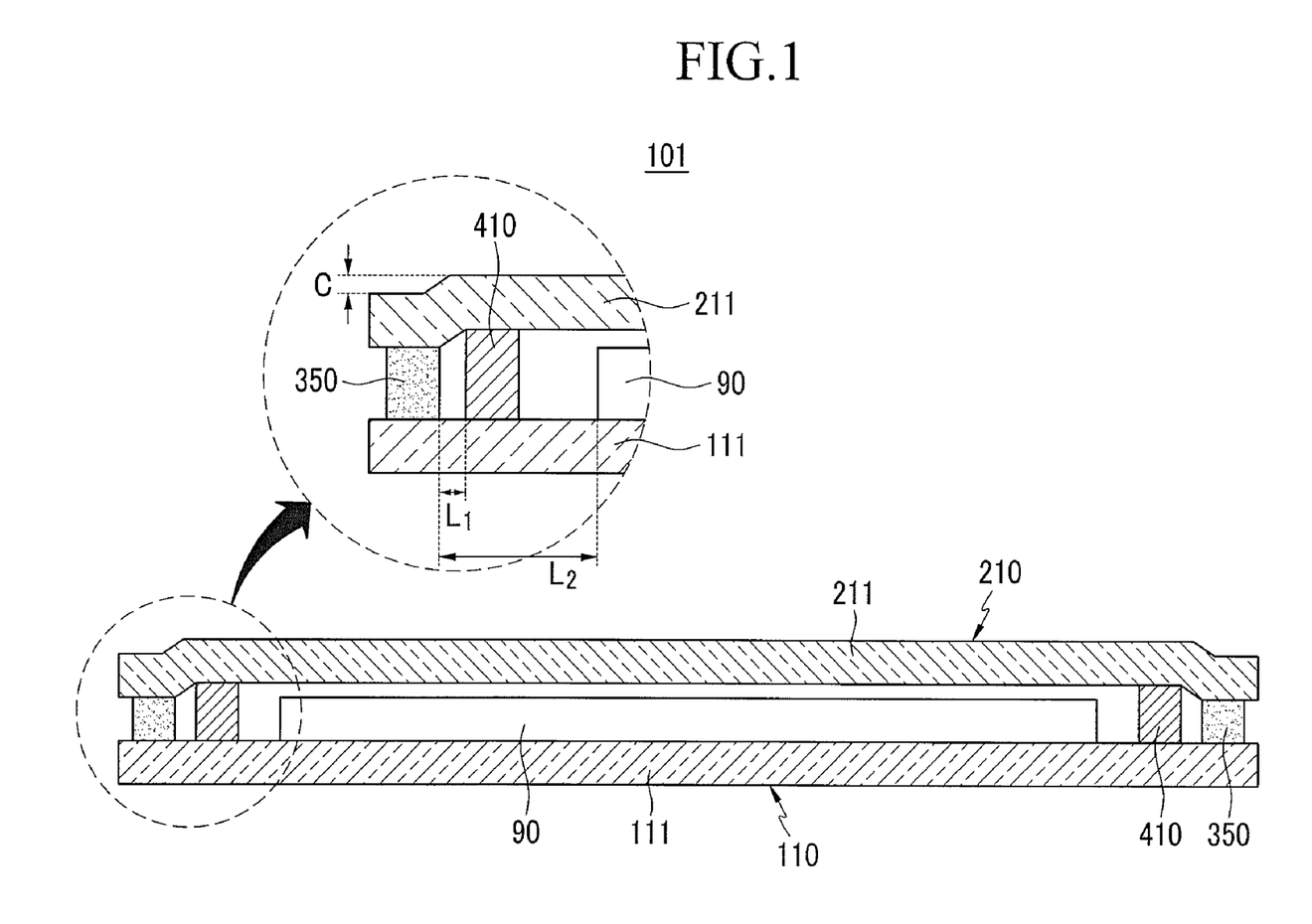
FIG. 1 is a cross-sectional view of an organic light emitting diode (OLED) display according to a first exemplary embodiment.

FIG. 1 is a cross-sectional view of an organic light emitting diode (OLED) display according to the first exemplary embodiment. FIG. 2 is a top plan view of the OLED display according to the first exemplary embodiment.

Figure 2:
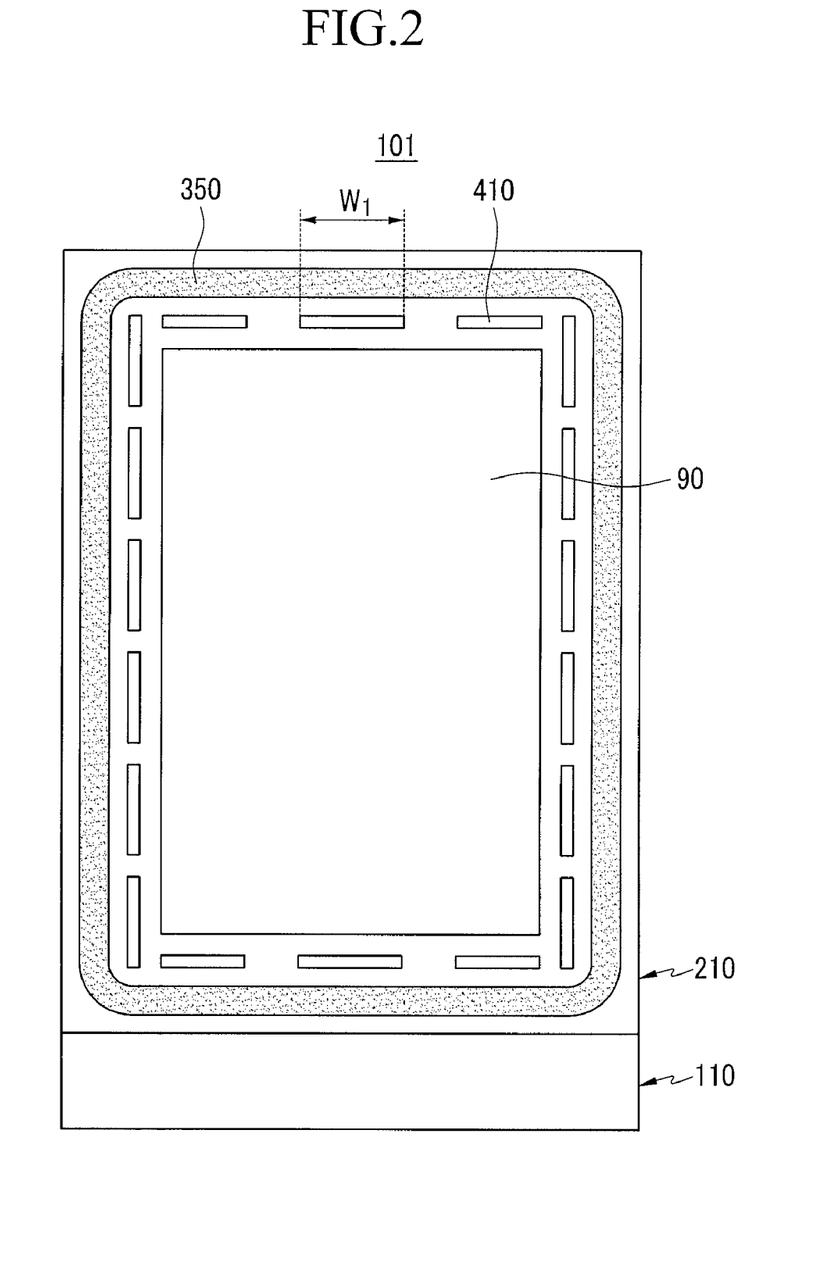
FIG. 2 is a top plan view of the OLED display according to the first exemplary embodiment.

As shown in FIG. 1 and FIG. 2, an organic light emitting diode (OLED) display 101 includes a display substrate assembly 110, an encapsulation substrate assembly 210, a sealant 350, and a substrate deformation protection (or deformation prevention) body 410.

The display substrate assembly 110 includes a first substrate main body 111 and an organic light emitting structure 90 having an organic light emitting element formed on the first substrate main body 111. The first substrate main body 111 may be formed of an insulative substrate made of glass, quartz, ceramic, and/or plastic. However, the first exemplary embodiment is not limited thereto. That is, the first substrate main body 111 may be formed of a metallic substrate made of stainless steel.

The encapsulation substrate assembly 210 is disposed facing the display substrate assembly 110 and covers the organic light emitting structure 90 of the display substrate assembly 110. The encapsulation substrate assembly 210 includes a second substrate main body 211. The second substrate main body 211 may be formed of a light-transparent material such as glass or plastic. An area of the entire second substrate main body 211 corresponding to the sealant 350 is deformed and twisted due to a volume reduction of the sealant 350 resulting from hardening of the sealant 350 so that it has a stepped difference C with respect to other areas of the second substrate main body 211.

The sealant 350 is arranged along the edges (or edge portions) of the display substrate assembly 110 and the encapsulation substrate assembly 210 so as to seal them in a vacuum-tight manner. The sealant 350 for sealing the display substrate assembly 110 and the encapsulation substrate assembly 210 in a vacuum-tight manner is reduced in volume when it is hardened. The sealant 350 may be hardened by, for example, ultraviolet (UV) rays and/or laser, and may be composed of a resin and/or frit.

The substrate deformation protection body 410 is disposed between the sealant 350 and the organic light emitting structure 90, between the display substrate assembly 110 and the encapsulation substrate assembly 210. The substrate deformation protection body 410 and the sealant 350 have a first gap $L_1$ therebetween, and the sealant 350 and the organic light emitting structure 90 have a second gal $L_2$ therebetween that is greater than the first gap $L_1$. That is, the sealant 350 is closer to the substrate deformation protection body 410 than to the organic light emitting structure 90. In addition, the height of the substrate deformation protection body 410 is greater than that of the sealant 350. The substrate deformation protection body 410 has a certain or predetermined height that is substantially equivalent to a certain or predetermined distance between the display substrate assembly 110 and the encapsulation substrate assembly 210. As described, the substrate deformation protection body 410 is close to the sealant 350, and the height of the substrate deformation protection body 410 is higher than the height of the sealant 350 so that a twist due to deformation of the encapsulation substrate assembly 210 resulting from the contraction of the sealant 350 occurs (or substantially occurs) only in the area corresponding to the sealant 350. That is, the twist due to deformation of the encapsulation substrate assembly 210 occurs only in the area corresponding to the sealant 350 by the substrate deformation protection body 410 so that the twist due to deformation of the encapsulation substrate assembly 210 according to contraction of the sealant 350 does not occur (or substantially does not occur) in an area corresponding to the organic light emitting structure 90.

Also, when the encapsulation substrate assembly 210 is deformed and thus twisted according to the contraction of the sealant 350, the twisted portion of the encapsulation substrate assembly 210 functions like a convex lens. As the twisted portion of the encapsulation substrate assembly 210 functions like the convex lens, Newton's rings occur in light of the organic light emitting structure 90 emitted corresponding to the display substrate assembly 110 parallel with the encapsulation substrate assembly 210 and the twisted portion of the encapsulation substrate assembly 210 in the comparative art. However, in the OLED display 101 according to the first exemplary embodiment, the twist due to deformation of the encapsulation substrate assembly 210 does not occur in the area corresponding to the organic light emitting structure 90 from which light is emitted due to the substrate deformation protection body 410 so that the Newton's rings do not occur in the light. That is, the OLED display according to first embodiment of the present invention does have the Newton's rings so that visibility of the OLED display can be improved.

Furthermore, the substrate deformation protection body 410 is provided as a multiple thereof, and the plurality of substrate deformation protection bodies 410 are each arranged apart from the sealant 350 at substantially identical distances from the sealant 350. The substrate deformation protection body 410 has a quadrant shape extending in a planar direction, that is, a direction parallel with the display substrate assembly 110 as shown in FIG. 2. Since the substrate deformation protection bodies 410 are arranged with the substantially identical distances apart from the sealant 350, a twist due to deformation of the encapsulation assembly 210 uniformly or constantly occurs in the arrangement direction of the sealant 350 so that damage to the encapsulation substrate assembly 210 according to the twist due to deformation thereof can be suppressed.

Furthermore, each of the plurality of substrate deformation protection bodies 410 has a width $W_1$ that is uniform in the arrangement direction of the sealant 350. In this case, it is preferred in one embodiment of the present invention that a gap between neighboring substrate deformation protection bodies 410 is sufficiently narrow to reduce or prevent twist due to deformation of a portion of the encapsulation substrate assembly 210 corresponding to the gap between the neighboring substrate deformation protection bodies 410 and between the organic light emitting structure 90 and the substrate deformation protection bodies 410.

The substrate deformation protection body 410 may be made of a resin such as a polyacrylate resin and a polyimide resin, or a silica-based inorganic material. In addition, the substrate deformation protection body 410 may be simultaneously formed with a pixel defining layer 190 through a photolithography process and/or a photo-etching process. For example, the substrate deformation protection body 410 and the pixel defining layer 190 may be simultaneously formed by controlling an exposure amount through a half-tone exposure. However, the first exemplary embodiment according to the present invention is not limited thereto. That is, the substrate deformation protection body 410 and the pixel defining layer 190 may be sequentially or individually formed, or may be made of different materials.

In another exemplary embodiment, a filling agent may be additionally provided in a space formed between the display substrate assembly 110 and the encapsulation substrate assembly 210. The filling agent fills the space between the display substrate assembly 110 and the encapsulation substrate assembly 210 to thereby improve mechanical strength of the OLED display 101.

Hereinafter, an internal structure of the OLED display 101 according to the first exemplary embodiment will be described with reference to FIG. 3 and FIG. 4.

Figure 3:
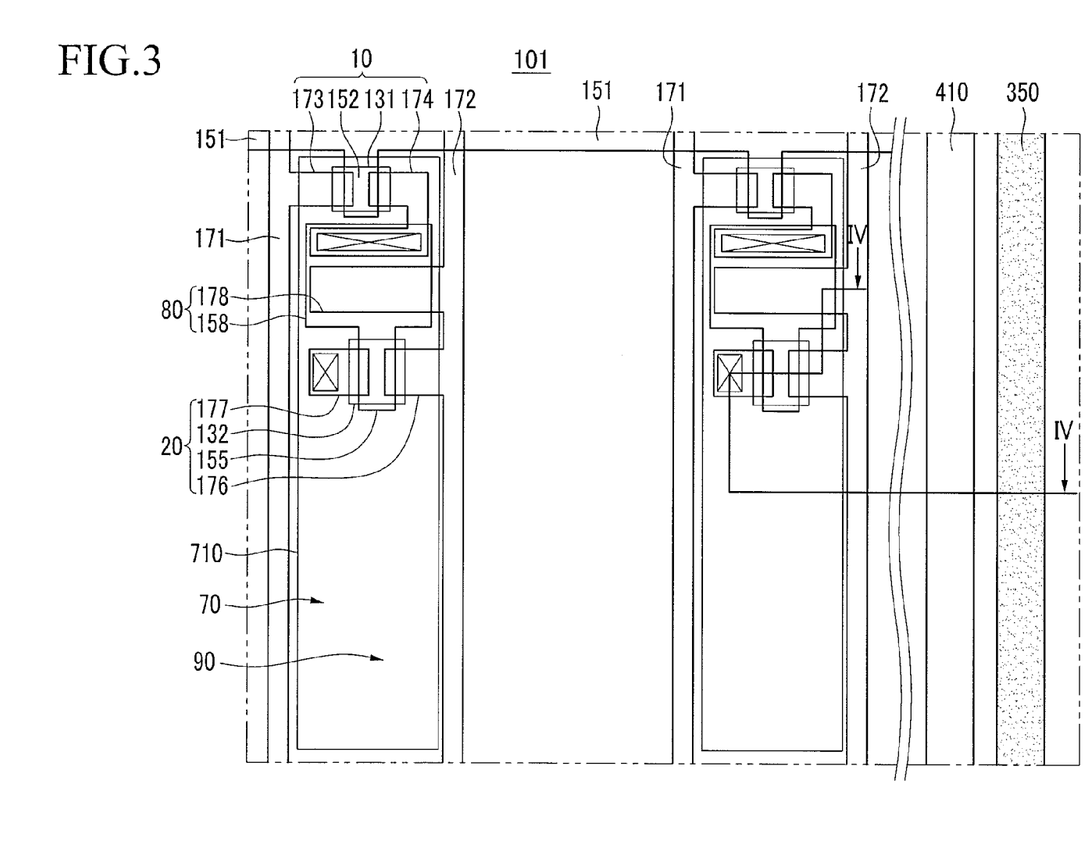
FIG. 3 is a layout view of a pixel structure of a display substrate assembly.

FIG. 3 is a layout view of a pixel structure of the display substrate assembly 110. FIG. 4 is a cross-sectional view of the display substrate assembly 110 and the encapsulation substrate assembly 210 of FIG. 3, taken along the line IV-IV.

Figure 4:
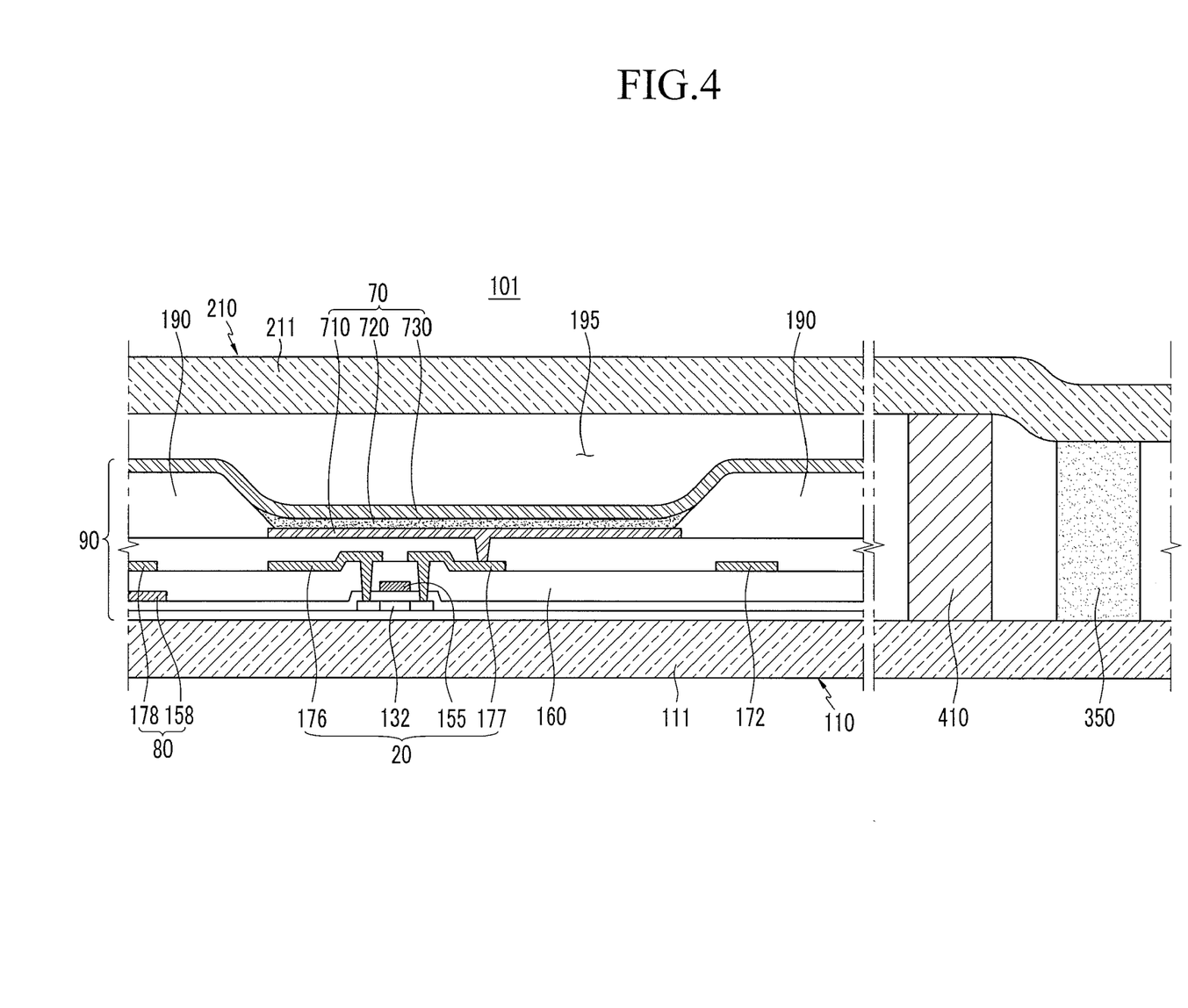
FIG. 4 is a cross-sectional view of the display substrate assembly and an encapsulation substrate assembly of FIG. 3, taken along the line IV-IV.

As shown in FIG. 3 and FIG. 4, the display substrate assembly 110 includes the organic light emitting structure 90, and the organic light emitting structure 90 includes a switching thin film transistor 10, a driving thin film transistor 20, a capacitor 80, an organic light emitting diode (OLED) 70, and a pixel defining layer 190, which are formed at each pixel. Here, a configuration including the switching thin film transistor 10, the driving thin film transistor 20, and the capacitor 80 forms a driving circuit DC. In addition, the display substrate assembly 110 further includes gate lines 151 arranged in one direction, data lines 171 crossing the gate lines 151 in an insulated manner, and a common power line 172. A pixel may be defined by taking the gate lines 151, the data line 171, and the common power line 172 as a boundary, but is not limited thereto.

The organic light emitting element 70 includes a pixel electrode 710, an organic emissive layer 720 formed on the pixel electrode 710, and a common electrode 730 formed on the organic emissive layer 720. Here, the pixel electrode 710 is a positive (+) electrode which is a hole injection electrode, and the common electrode 730 is a negative (−) electrode which is an electron injection electrode. However, the first exemplary embodiment is not limited thereto. That is, the pixel electrode 710 may be a negative electrode, and the common electrode 730 may be a positive electrode according to a driving method of the OLED display 101. Holes and electrons from the pixel electrode 710 and the common electrode 720 are respectively injected into the organic emissive layer 720. When excitons being combinations of the injected holes and electrons fall from an excited state to a ground state, the organic light emitting diode 70 emits light.

The organic light emitting element 70 of the OLED display 101 according to the first exemplary embodiment emits light in a direction of the encapsulation substrate assembly 210. That is, the organic light emitting element 70 is a front emission type. Here, in order for the organic light emitting diode 70 to emit light in the direction of the encapsulation substrate assembly 210, the pixel electrode 710 is formed as a reflective electrode, and the common electrode 730 is formed as a transparent or semi-transparent electrode. However, the OLED display 101 according to the first exemplary embodiment is not limited to the front emission type. That is, the OLED display 101 may be a rear emission type or a dual-side emission type.

The capacitor 80 includes a pair of capacitor plates 158 and 178 arranged, with an interlayer insulating layer 160 interposed therebetween. Here, the interlayer insulating layer 160 functions as a dielectric material. The capacitance is determined depending upon charges charged at the capacitor 80 and the voltages applied to the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting pixels to emit light. The switching gate electrode 152 is connected to the gate line 151. The switching source electrode 173 is connected to the data line 171. The switching drain electrode 174 is spaced apart from the switching source electrode 173 by a distance, and is connected to the capacitor plate 158.

The driving thin film transistor 20 applies driving power for exciting the organic emissive layer 720 of the organic light emitting diode 70 within the selected pixel to the pixel electrode 710. The driving gate electrode 155 is connected to the capacitor plate 158 that is connected to the switching drain electrode 174. The driving source electrode 176 and the other capacitor plate 178 are connected to the common power line 172, respectively. The driving drain electrode 177 is connected to the pixel electrode 170 of the organic light emitting diode 70 through a contact hole.

With the above structure, the switching thin film transistor 10 is driven by the gate voltage applied to the gate line 151 so as to transmit the data voltage applied to the data line 171 to the driving thin film transistor 20. A voltage being a difference between the common voltage applied from the common power line 172 to the driving thin film transistor 20 and the data voltage transmitted thereto from the switching thin film transistor 10 is stored at the capacitor 80, and a current corresponding to the voltage stored at the capacitor 80 flows to the organic light emitting diode 70 through the driving thin film transistor 20 so that the organic light emitting diode 70 emits light.

The pixel defining layer 190 surrounds the organic light emitting element 70, and includes an opening 195 that defines a light emission area of the organic light emitting element 70. The pixel defining layer 190 may be formed with a resin such as polyacrylate resin and polyimide resin, or a silica-based inorganic material that is substantially identical to the material of the substrate deformation protection body 410.

The substrate deformation protection body 410 is disposed neighboring the above-described organic light emitting structure 90, and the sealant 350 is disposed along the edge of the display substrate assembly 110 to the outside of the substrate deformation protection body 410.

Hereinafter, a manufacturing method of the OLED display 101 according to the first exemplary embodiment will be described with reference to FIG. 5 and FIG. 6.

Figure 5:
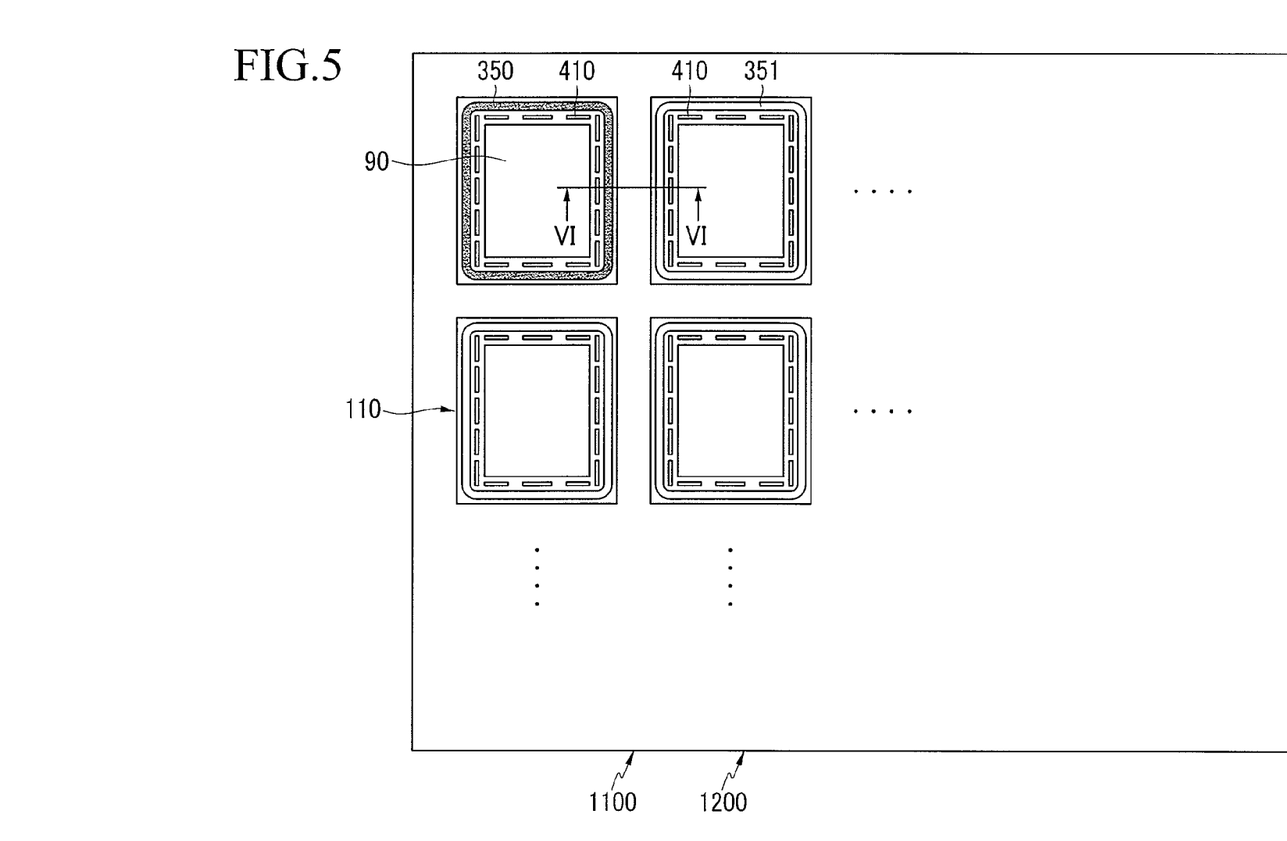
FIG. 5 is a top plan view for describing a manufacturing process of the OLED display according to the first exemplary embodiment.

FIG. 5 is a top plan view for describing a manufacturing method of the OLED display according to the first exemplary embodiment. FIG. 6 is a cross-sectional view of FIG. 5, taken along the line VI-VI.

Figure 6:
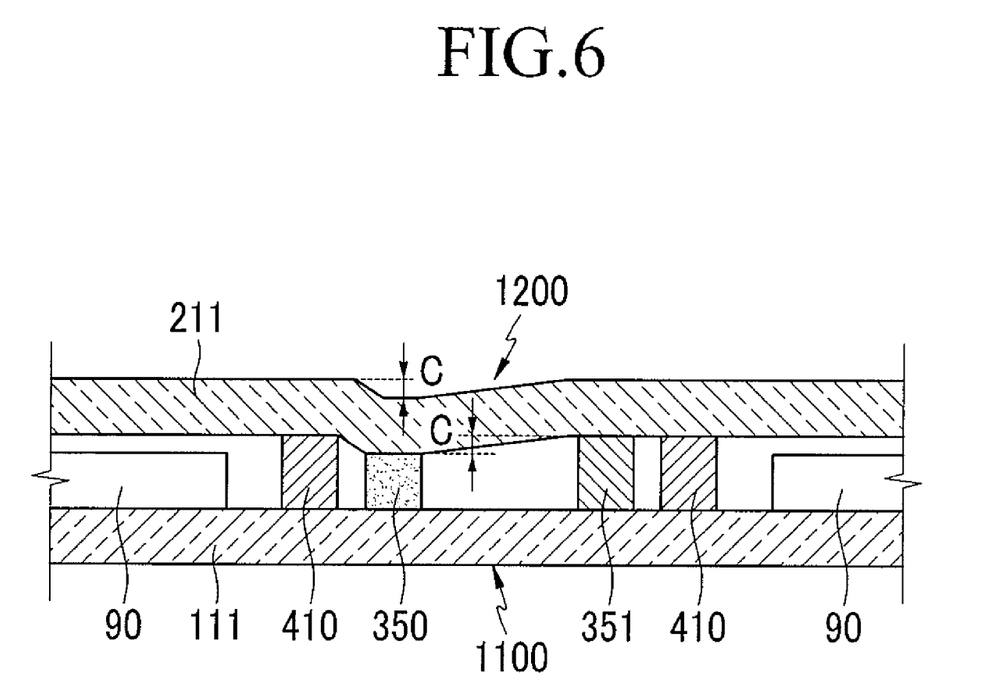
FIG. 6 is a cross-sectional view of FIG. 5, taken along the line VI-VI.

As shown in FIG. 5 and FIG. 6, a plurality of display substrate assemblies 110, each including the organic light emitting structure 90 is formed on a first mother substrate 1100.

Next, the substrate deformation protection body 410 is formed on each display substrate assembly 110.

In more detail, the substrate deformation protection body 410 is disposed between the organic light emitting structure 90 and the sealant 350, and a distance between the substrate deformation protection body 410 and the sealant 350 is set to be smaller than a distance between the sealant 350 and the organic light emitting structure 90. The substrate deformation protection body 410 and the pixel defining layer 190 of the organic light emitting structure 90 may be simultaneously formed.

A sealant 351 before being hardened is formed along the edge of each display substrate assembly 110 formed on the first mother substrate 1100.

In more detail, the height of the sealant 351 before being hardened may be substantially equivalent to that of the substrate deformation protection body 410.

After arranging a second mother substrate 1200 on the first mother substrate 1100, the first and second mother substrates 1100 and 1200 are attached to each other.

The sealant 350 disposed between the first and second mother substrates 1100 and 1200 is hardened through the second mother substrate 1200 by using, for example, ultraviolet (UV) rays and/or laser.

In more detail, the sealant 351 before being hardened is hardened by, for example, the ultraviolet (UV) rays and/or laser, and is reduced in volume due to the hardening. Since the unhardened sealant 351 experiences volume reduction after being hardened, the second substrate main body 211 of the encapsulation substrate assembly 210 of the second mother substrate 1200 has a deformed and twisted area corresponding to the sealant 350. In this case, the substrate deformation protection body 410 suppresses twist of the encapsulation substrate assembly 210 due to deformation thereof corresponding to the organic light emitting structure 90. That is, only the area of the encapsulation substrate assembly 210, corresponding to the sealant 350 has a stepped difference C with the area corresponding to the organic light emitting structure 90.

Each of the OLED displays 101 is manufactured by cutting out neighboring OLED displays 101 with a cut-out mechanism such as a mechanical tool and/or a laser. In this case, the area of the encapsulation substrate assembly 210, corresponding to the sealant 350 and an area of the neighboring encapsulation substrate assembly 210, balance mechanical stress by using the substrate deformation protection body 410 so that damage to the encapsulation substrate assembly 210 due to stress from a cut-out process can be suppressed during the cut-out process.

Accordingly, mechanical stress of the encapsulation substrate assembly 210 can be balanced so that strength of the encapsulation substrate assembly 210 can be improved.

As described, the area of the encapsulation substrate assembly 210, corresponding to the organic light emitting structure 90 is not twisted by the substrate deformation protection body 410 so that the Newton's rings that are interference of light generated from a contact between flat glass and a convex lens do not occur in the OLED display 101, and accordingly visibility of the OLED display 101 can be improved.

In addition, an area that experiences twist due to deformation of the encapsulation substrate assembly 210 is limited by the substrate deformation protection body 410 so that damage to the encapsulation substrate assembly 210 due to twist of the encapsulation substrate assembly 210 can be suppressed.

Hereinafter, a second exemplary embodiment will be described with reference to FIG. 7.

Figure 7:
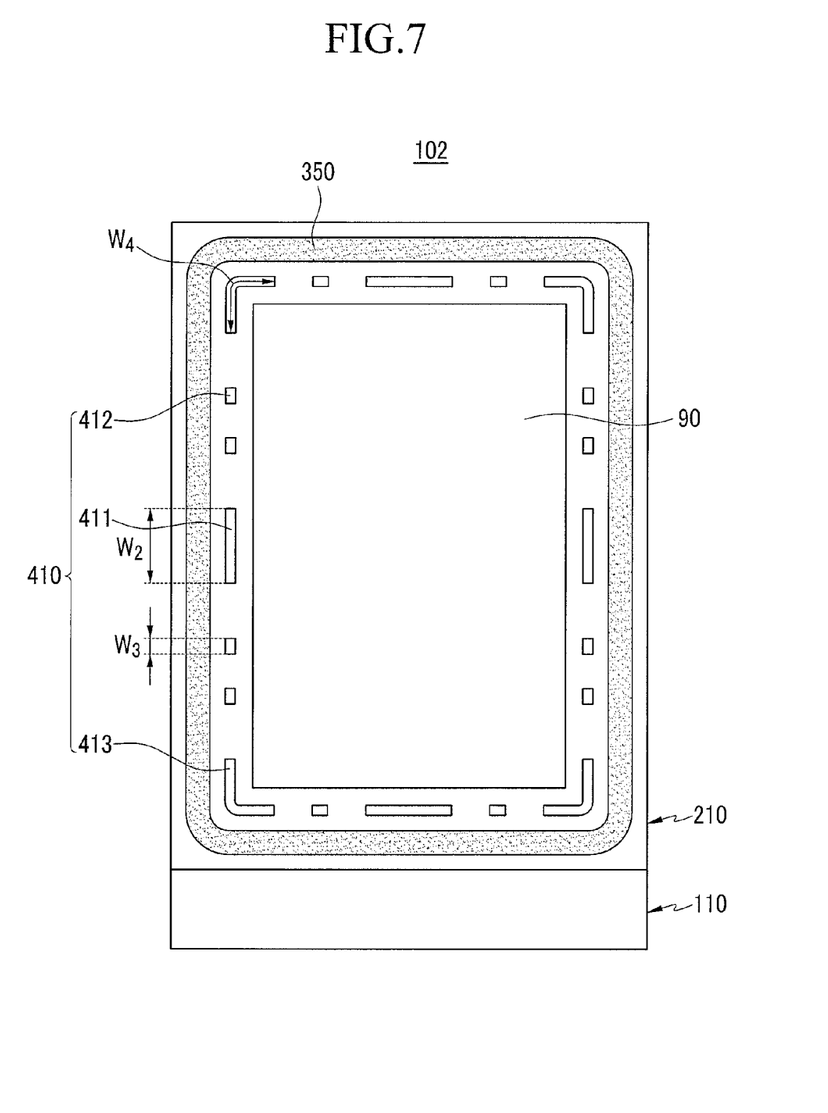
FIG. 7 is a top plan view of an OLED display according to a second exemplary embodiment.

FIG. 7 is a top plan view of an OLED display according to the second exemplary embodiment.

As shown in FIG. 7, a substrate deformation protection body 410 of an OLED display 102 according to the second exemplary embodiment includes a first sub-substrate deformation protection body 411, a second sub-substrate deformation protection body 412, and a third sub-substrate deformation protection body 413, each having a width that is non-uniform in an arrangement direction of a sealant 350. The first sub-substrate deformation protection body 411, the second sub-substrate deformation protection body 412, and the third sub-substrate deformation protection body 413 are shown to have a quadrangle shape with respect to a direction that is parallel with a display substrate, but the present invention is not thereto. For example, the deformation protection bodies may have a polygon sectional shape including a triangle and/or pentagon sectional shape.

The first sub-substrate deformation protection body 411 is formed as a bar shape extending in one direction, and has a width $W_2$ that is larger than that of the second sub-substrate deformation protection body 412.

The second sub-substrate deformation protection body 412 is arranged between the first sub-substrate deformation protection body 411 and the third sub-substrate deformation protection body 413, and has a width $W_3$ that is shorter than that of the first and third sub-substrate deformation protection bodies 411 and 413.

The third sub-substrate deformation protection body 413 extends with a curved line shape corresponding to a curved line portion extended from the sealant 350, and has a width W4 that is larger than that of the first and second sub-substrate deformation protection bodies 411 and 412.

As described, the substrate deformation protection body 410 of the OLED display 102 according to the second exemplary embodiment has the third sub-substrate deformation protection body 413 extended with a curved line shape corresponding to the curved line portion of the sealant 350 so that mechanical strength of the curved line portion receiving thermal stress due to, for example, ultraviolet (UV) rays and/or laser, more than any other portion during a hardening process of the sealant 350 can be enforced.

Hereinafter, a third exemplary embodiment will be described with reference to FIG. 8.

Figure 8:
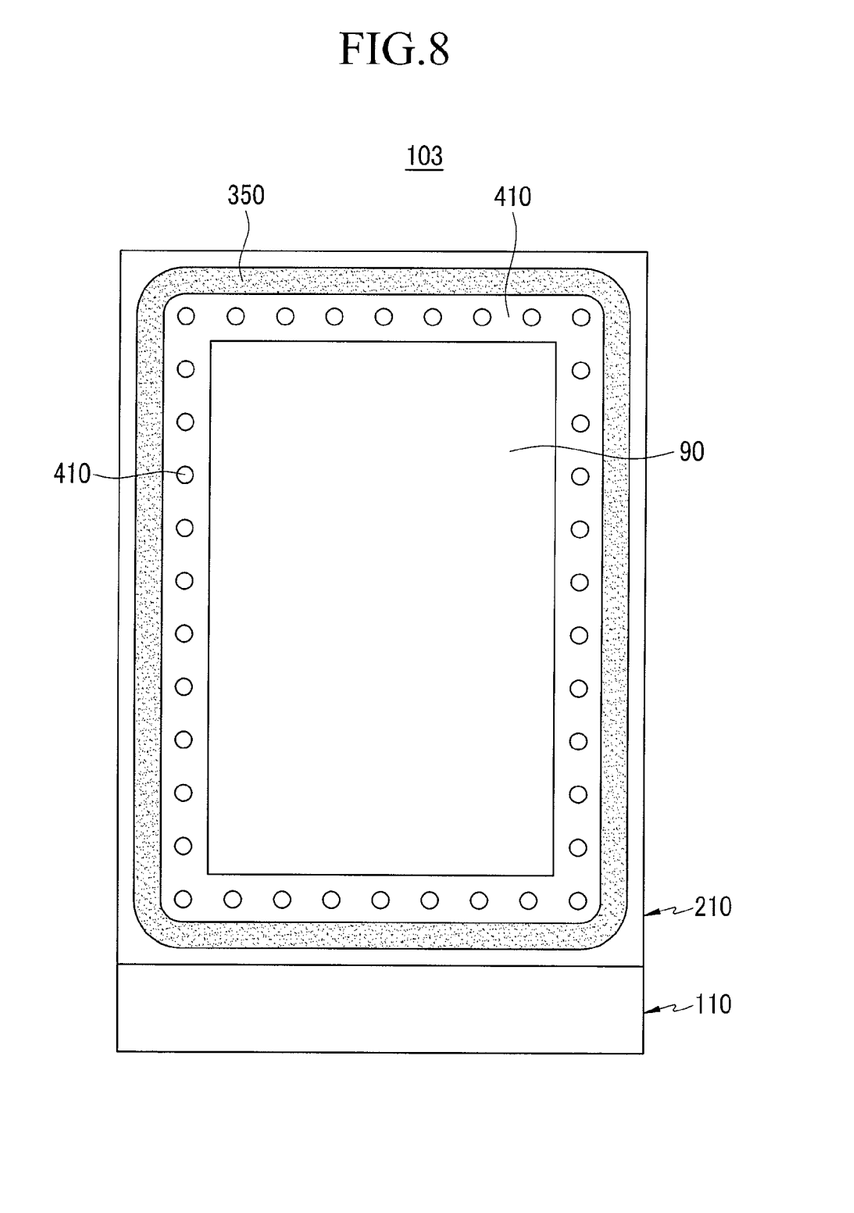
FIG. 8 is a top plan view of an OLED display according to a third exemplary embodiment.

FIG. 8 is a top plan view of an OLED display according to a third exemplary embodiment.

As shown in FIG. 8, a substrate deformation protection body 410 of an OLED display according to a third exemplary embodiment has a circular sectional shape with respect to a direction that is parallel with a display substrate. The substrate deformation protection body 410 is provided in plural numbers, each having the same circular sectional shape, but the present invention is not limited thereto. For example, each of the plurality of substrate deformation protection bodies 410 may have various shapes considering thermal stress of an encapsulation substrate assembly 210 during a hardening process of a sealant 350 corresponding to an area where each of the substrate deformation protection bodies 410 is disposed.

A fourth exemplary embodiment will now be described with reference to FIG. 9.

Figure 9:
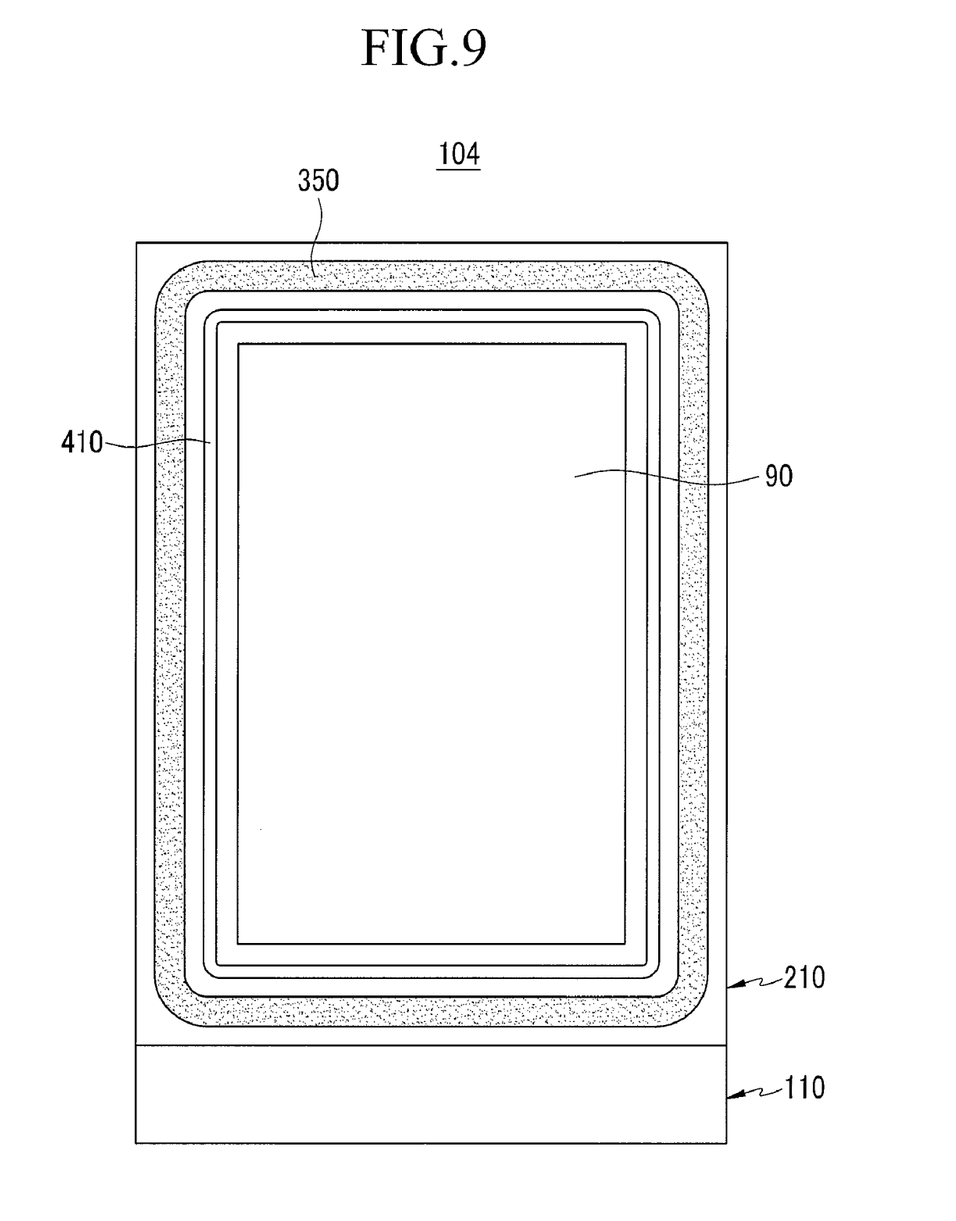
FIG. 9 is a top plan view of an OLED display according to a fourth exemplary embodiment.

FIG. 9 is a top plan view of an OLED display according to a fourth exemplary embodiment.

As shown in FIG. 9, a substrate deformation protection body 410 of an OLED display 103 according to the fourth exemplary embodiment is continuously extended in an extension direction of a sealant 350. The substrate deformation protection body 410 continuously extends along the sealant 350, but the present invention is not limited thereto. For example, the substrate deformation protection body 410 may be partially discontinued in consideration of thermal stress of an encapsulation substrate assembly 210 during a hardening process of a sealant 350 corresponding to an area where each of the substrate deformation protection bodies 410 is disposed.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
a display substrate assembly comprising a display substrate and an organic light emitting structure;
an encapsulation substrate assembly facing the display substrate assembly;
a sealant between the display substrate assembly and the encapsulation substrate assembly to seal the display substrate assembly and the encapsulation substrate assembly with each other; and
a substrate deformation protection body between the sealant and a region of the organic light emitting structure, the region being adjacent the display substrate.

2. The OLED display of claim 1, wherein a distance between the substrate deformation protection body and the sealant is smaller than a distance between the sealant and the organic light emitting structure.

3. The OLED display of claim 1, wherein the height of the substrate deformation protection body is greater than that of the sealant.

4. The OLED display of claim 3, wherein the sealant is arranged along edge portions of the display substrate assembly and the encapsulation substrate assembly, and the substrate deformation protection body comprises a plurality of substrate deformation protection bodies.

5. The OLED display of claim 4, wherein the plurality of substrate deformation protection bodies are arranged apart from the sealant by substantially identical distances.

6. The OLED display of claim 4, wherein the plurality of substrate deformation protection bodies each have uniform widths along an arrangement direction of the sealant.

7. The OLED display of claim 4, wherein the plurality of substrate deformation protection bodies have non-uniform widths along an arrangement direction of the sealant.

8. The OLED display of claim 4, wherein the sealant comprises an extended curved line portion, and a first substrate prevention body among the plurality of substrate deformation protection bodies corresponding to the curved line portion of the sealant has a width that is larger than those of other non-curved line corresponding substrate deformation protection bodies among the plurality of substrate protection bodies along an arrangement direction of the sealant.

9. The OLED display of claim 3, wherein the sealant is disposed to extend along edge portions of the display substrate assembly and the encapsulation substrate assembly, and the substrate deformation protection body extends along an extension direction of the sealant.

10. The OLED display of claim 1, wherein the substrate deformation protection body has a polygonal sectional shape with respect to a direction that is parallel with the display substrate assembly.

11. The OLED display of claim 1, wherein the substrate deformation protection body has a circular sectional shape with respect to a direction that is parallel with the display substrate assembly.

12. An organic light emitting diode (OLED) display comprising:
a display substrate assembly comprising an organic light emitting structure;
an encapsulation substrate assembly facing the display substrate assembly;
a sealant between the display substrate assembly and the encapsulation substrate assembly to seal the display substrate assembly and the encapsulation substrate assembly with each other; and
a substrate deformation protection body between the sealant and the organic light emitting structure,
wherein a height of the substrate deformation protection body is substantially equal to a distance between the display substrate assembly and the encapsulation substrate assembly.

* * * * *